United States Patent
Hasso et al.

(10) Patent No.: US 12,398,299 B2
(45) Date of Patent: Aug. 26, 2025

(54) WATERBORNE DISPERSION COMPOSITION

(71) Applicants: Dow Global Technologies LLC, Midland, MI (US); Dow Silicones Corporation, Midland, MI (US); Rohm and Haas Company, Collegeville, PA (US)

(72) Inventors: Douglas J. Hasso, Auburn, MI (US); Yinzhong Guo, Pearland, TX (US); James M. Lipovsky, Upper Holland, PA (US); Ludwik S. Cygan, Downers Grove, IL (US); Carlos A. Escobar Marin, Midland, MI (US); Joseph D. Jacobs, Yardley, PA (US)

(73) Assignees: Dow Global Technologies LLC, Midland, MI (US); Dow Silicones Corporation, Midland, MI (US); Rohm and Haas Company, Collegeville, PA (US)

( * ) Notice: Subject to any disclaimer, the term of this patent is extended or adjusted under 35 U.S.C. 154(b) by 394 days.

(21) Appl. No.: 17/604,433

(22) PCT Filed: Mar. 2, 2020

(86) PCT No.: PCT/US2020/020636
§ 371 (c)(1),
(2) Date: Oct. 17, 2021

(87) PCT Pub. No.: WO2021/173154
PCT Pub. Date: Sep. 2, 2021

(65) Prior Publication Data
US 2022/0351980 A1   Nov. 3, 2022

Related U.S. Application Data

(60) Provisional application No. 62/834,993, filed on Apr. 17, 2019.

(51) Int. Cl.
| | | |
|---|---|---|
| *C09J 131/04* | (2006.01) | |
| *C08J 3/05* | (2006.01) | |
| *C09D 131/04* | (2006.01) | |
| *H01L 21/311* | (2006.01) | |

(52) U.S. Cl.
CPC ............... *C09J 131/04* (2013.01); *C08J 3/05* (2013.01); *C09D 131/04* (2013.01); *H01L 21/31116* (2013.01); *C08J 2331/04* (2013.01); *C09J 2301/304* (2020.08)

(58) Field of Classification Search
CPC . C08J 2323/08; C08J 3/03; C08J 3/005; C08J 2331/04; C09D 123/0853; C09D 123/08; C09D 191/06; C09D 193/04; C09D 131/04; C09J 123/0853; C09J 123/08; C09J 131/04; C09J 2301/304; C08L 23/08; C08L 23/04; C08K 5/09; C08K 5/092; B01F 27/27
See application file for complete search history.

(56) References Cited

U.S. PATENT DOCUMENTS

| | | |
|---|---|---|
| 8,791,204 B2 | 7/2014 | Choudhery |
| 9,701,824 B2 | 7/2017 | Crimmins et al. |
| 2014/0094537 A1* | 4/2014 | Schmidt ............... C10L 1/1973 524/401 |
| 2018/0282488 A1 | 10/2018 | Chen et al. |
| 2020/0392297 A1* | 12/2020 | Escobar Marin .... C09D 193/04 |

FOREIGN PATENT DOCUMENTS

| | | |
|---|---|---|
| CN | 108084370 A | 5/2018 |
| CN | 108102472 A | 6/2018 |
| CN | 108148215 A | 6/2018 |
| EP | 3246370 A1 | 11/2017 |
| WO | 2012/170242 A1 | 12/2012 |
| WO | 2012170241 A1 | 12/2012 |
| WO | 2019089113 A1 | 5/2019 |

OTHER PUBLICATIONS

PCT/US2020/020636, International Search Report and Written Opinion with a mailing date of Jun. 9, 2020.
PCT/US2020/020636, International Preliminary Report on Patentability with a mailing date of Sep. 28, 2021.

* cited by examiner

*Primary Examiner* — Ana L. Woodward
(74) *Attorney, Agent, or Firm* — Boyle Fredrickson S.C.

(57) ABSTRACT

Methods and apparatus for etching a high aspect ratio feature in a stack on a substrate are provided. The feature may be formed in the process of forming a 3D NAND device. Typically, the stack includes alternating layers of material such as silicon oxide and silicon nitride or silicon oxide and polysilicon. $WF_6$ is provided in the etch chemistry, which substantially reduces or eliminates problematic sidewall notching. Advantageously, this improvement in sidewall notching does not introduce other tradeoffs such as increased bowing, decreased selectivity, increased capping, or decreased etch rate.

19 Claims, 6 Drawing Sheets

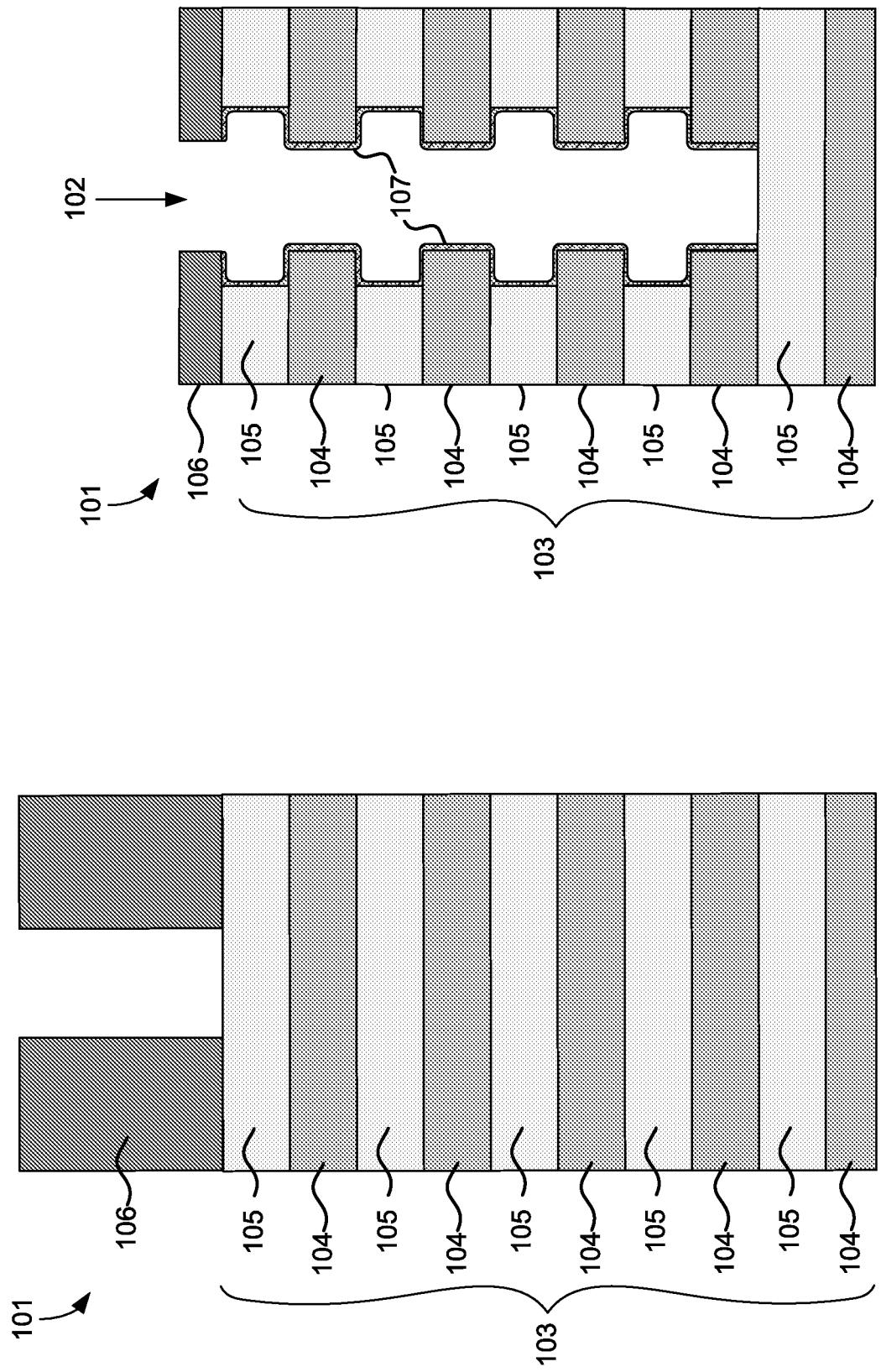

WATERBORNE DISPERSION COMPOSITION

FIELD

Figure 3:
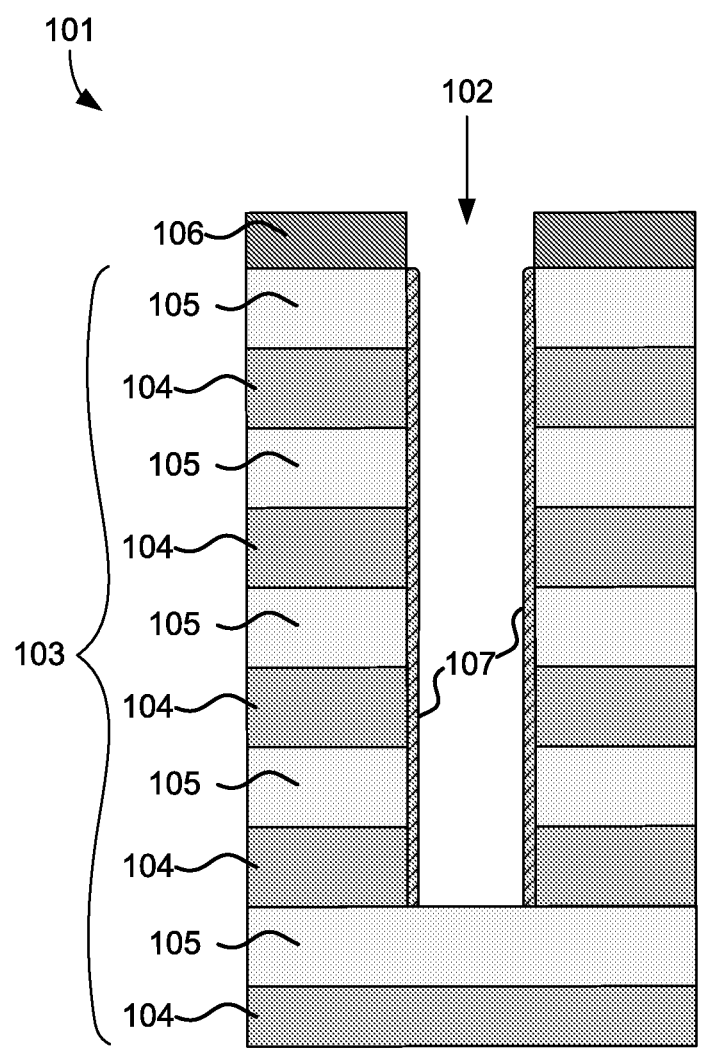
Figure 4:
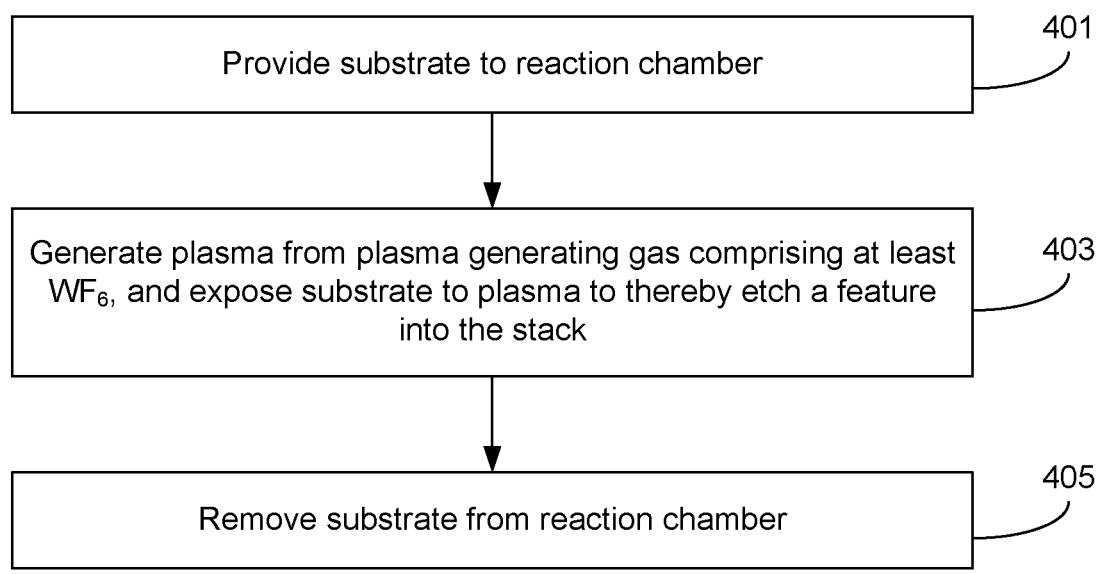
Figure 5A:
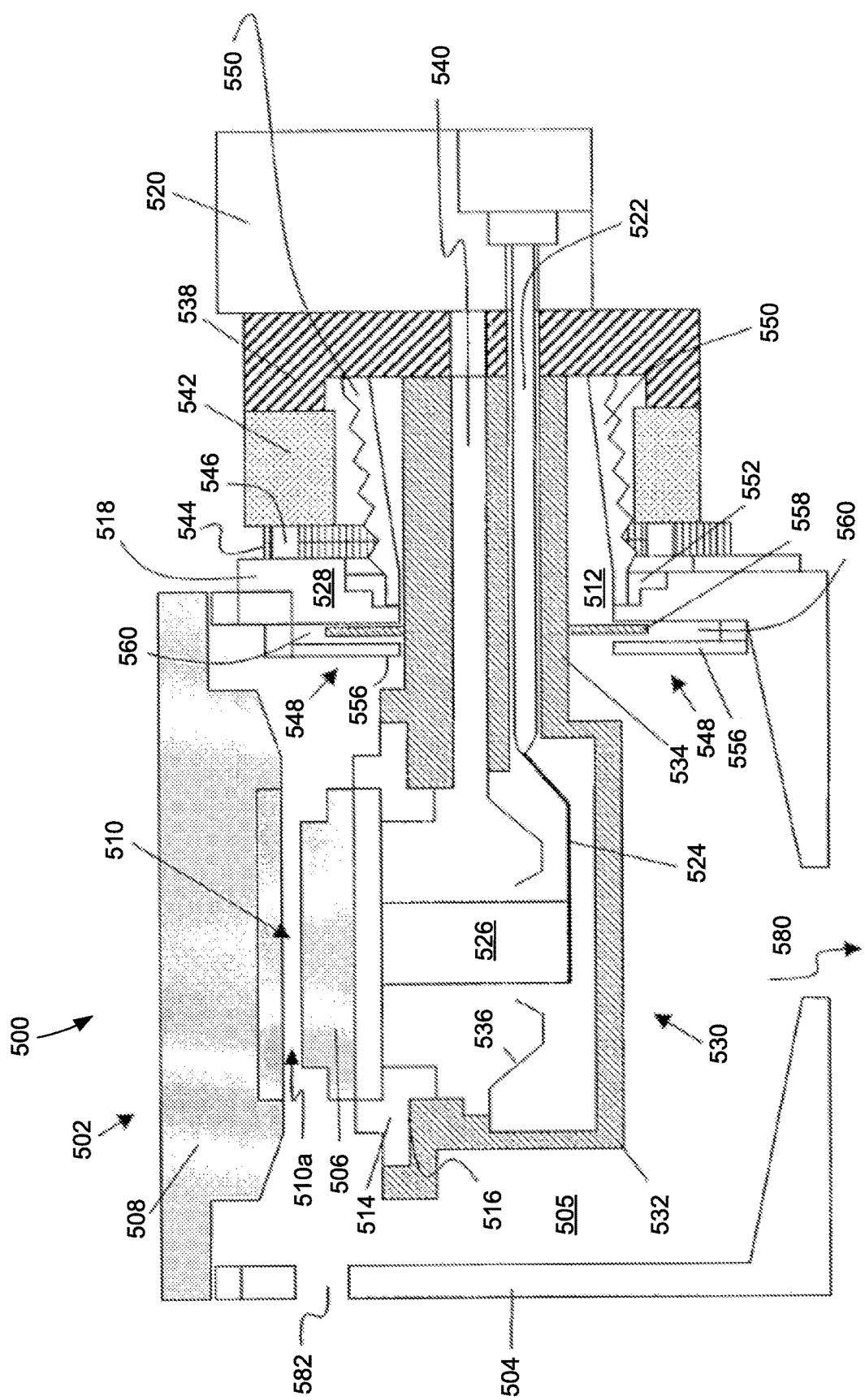
Figure 5B:
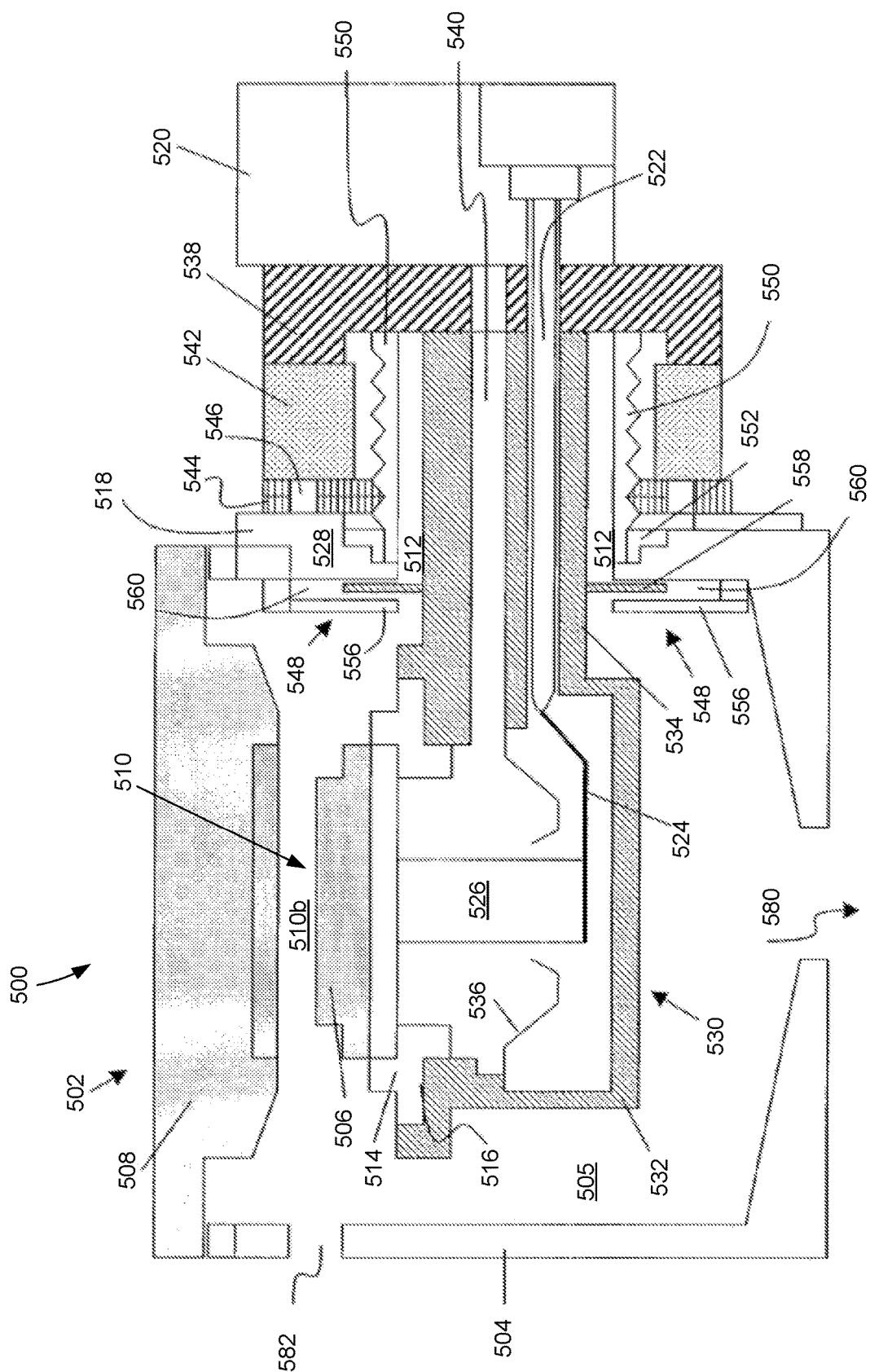
Figure 5C:
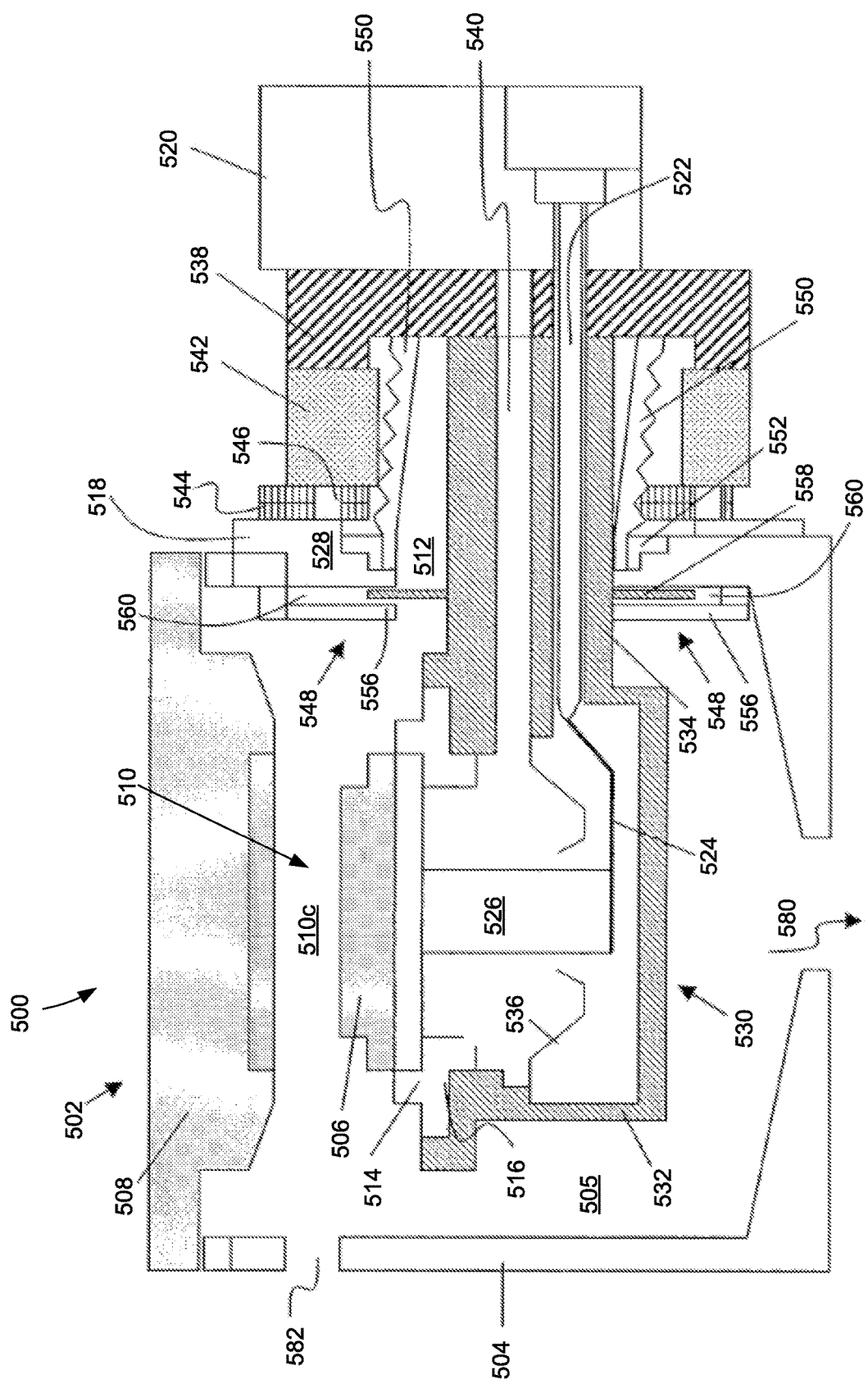

The present invention relates to a waterborne dispersion composition useful as a heat seal coating (HSC); and more specifically, the present invention relates to a waterborne dispersion composition, useful as a HSC, generated by a continuous extruder-based phase inversion process.

BACKGROUND

In the food and industrial packaging industry, polymeric packages are typically heat sealed at low temperatures (e.g., less than [<] 150 degrees Celsius [C]) using an adhesive composition; and at low temperatures, the adhesive composition should: (1) be stable, (2) have a reasonable particle size and particle size distribution, (3) have a viscosity and rheology property that allows the composition to be easily applied to a substrate and which can be coated on a substrate to provide a uniform heat sealing coating; (4) be environmentally friendly, and (5) meet food contact regulatory requirements so to be suitable for packaging of foods.

Heretofore, various emulsification processes at various process conditions (e.g., at high temperatures and high pressures) have been used to prepare a low-temperature heat seal composition for use as an emulsion adhesive product, for example, as disclosed in CN108084370A, CN108148215A, and CN108102472A. In addition, continuous extruder-based direct dispersion processes have also been used for preparing a waterborne ethylene-vinyl acetate copolymer (EVA copolymer)-based heat seal product wherein a polymer melt blend is contacted with an aqueous stream including a neutralizing agent, water, and surfactant in an emulsification zone of an extruder to form a dispersion. However, the above direct emulsification processes suffer from one or more of problems such as for example, the emulsions produced by the processes have a broad particle size distribution which can lead to potential coating appearance issues such as yellowing, potential less shelf life stability, non-uniform particle compositions from particle to particle, and the like. In view of the above existing problems with the prior art emulsions and processes, it would be desirous to provide a dispersion composition which can be used as heat seal coating that does not have the above problems.

SUMMARY

The present invention is directed to a novel waterborne vinyl acetate copolymer dispersion composition useful as a HSC. In accordance with one preferred embodiment of the present invention, a vinyl acetate copolymer can include for example, an ethylene vinyl acetate (EVA) copolymer dispersion composition. In another preferred embodiment, the dispersion composition can include the following components: (a) at least one vinyl acetate copolymer; (b) at least one compatibilizer; (c) at least one alkyl carboxylic acid as dispersing agent after neutralization; (d) a first water addition to provide a polymer continuous dispersion; (e) at least one base added to neutralize the available acid, separate from the water addition that continues to result in a polymer continuous system; and (f) a second water addition to provide a phase invert to a water continuous dispersion.

In another embodiment, the present invention includes a process for producing the waterborne vinyl acetate copolymer dispersion composition useful as a HSC, wherein the process includes generating the dispersion using a continuous extruder-based phase inversion process. The process is advantaged because the process is able to generate a dispersion having a smaller particle size and a narrower particle size distribution with lower amounts (e.g., <1.5 weight percent [wt %]) of surfactant than a direct emulsification process using a continuous extruder. The use of an increased amount (e.g., greater than [>] 2 wt %) of surfactant can have an adverse effect on the application performance of the resulting dispersion product, such as less water resistance and less durability performance due to surfactant surface migration.

In still another embodiment, the present invention includes a HSC prepared from the above dispersion composition; and a substrate containing a HSC on at least a portion of the substrate's surface.

In yet another embodiment, the present invention includes food and industrial packaging material heat sealed with the above HSC; and heat seal articles prepared with the above HSC compositions.

DETAILED DESCRIPTION

A "compatibilizer" herein means a resin that has a viscosity of >1 pascal-seconds (Pa·s) at 170° C., with an acid value between 50 milligrams of potassium hydroxide (KOH) per gram of resin (mg KOH/g resin) and 200 mg KOH/g resin; and that has a melting point of above 100° C.

A "dispersing agent" herein means a fatty acid, in-situ generated, soap.

A "neutralization agent" herein means a compound which is used to neutralize an acid such as the alkyl carboxylic acid described herein. Examples of neutralization agents include, for example, KOH, ammonia, NaOH, amines, and mixtures thereof.

Water herein means deionized (DI) water qualified for use in making the waterborne dispersion of the present invention.

In a broad embodiment, the dispersion composition of the present invention includes: (a) at least one vinyl acetate copolymer such as EVA; (b) at least one compatibilizer; (c) at least one dispersing agent; (d) a first water addition to provide a polymer continuous dispersion; (e) at least one base added to neutralize the available acid, separate from the water addition that continues to result in a polymer continuous system; and (f) a second water addition to provide a phase inversion to a water continuous dispersion.

The vinyl acetate copolymer compound that is used to prepare the dispersion composition of the present invention includes, for example, one or more vinyl acetate copolymer compounds known in the art. For example, the copolymer compound includes ethylene vinyl acetate copolymer (EVA); vinyl acetate ethylene copolymer (VAE); other vinyl acetate copolymers such as vinyl acetate acrylate copolymers and vinyl acetate-ethylene-styrene copolymers; and the like; and mixtures thereof.

The amount of copolymer compound used to prepare the dispersion composition of the present invention is, for example, from 50 wt % to 90 wt % in one embodiment, from 80 wt % to 90 wt % in another embodiment and from 85 wt % to 90 wt % in still another embodiment in total solid content.

Exemplary of some of the advantageous properties exhibited by the vinyl acetate copolymer compound can include better adhesion to polyethylene terephthalate (PET), foils and other substrates.

In another embodiment, the copolymer is generated, for example, by using as one of the monomers (i.e., the co-monomer with the vinyl acetate co-monomer), a monomer containing an oxygen element. For example, the co-monomer, in addition to alkenes such as ethylene, is selected from one or more of the following compounds: vinyl acetate, acrylates, methacrylates, acrylic nitrile, and the like; and mixtures thereof.

The amount of co-monomer compound, when used with the vinyl acetate co-monomer, is, for example, from 5 wt % to 70 wt % in one embodiment, from 10 wt % to 50 wt % in another embodiment, from 15 wt % to 40 wt % in still another embodiment and from 15 wt % to 30 wt % in yet another embodiment.

The compatibilizer compound that is used to prepare the dispersion composition of the present invention includes, for example, one or more compatibilizer compounds known in the art. For example, in one embodiment the compatibilizer compound includes rosin acids, rosin esters, terpene phenolics, pure monomer resins, and phenolic resins or their mixtures In general, the compatibilizer compound has a viscosity of >1 Pa·s at 170° C. in one embodiment, from 1 Pa·s to 20 Pa·s in another embodiment, and from 5 Pa·s to 8 Pa·s in still another embodiment. The viscosity of the compatibilizer is measured by any well-known means such as by using a conventional viscometer, for example, a Brookfield Thermosel.

In general, the compatibilizer compound has an acid value of from 10 mg KOH/g resin to 250 mg KOH/g resin in one embodiment, from 50 mg KOH/g resin to 200 mg KOH/g resin in another embodiment, from 100 mg KOH/g resin to 200 mg KOH/g resin in still another embodiment; from 125 mg KOH/g resin to 200 mg KOH/g resin in yet another embodiment and from 140 mg KOH/g resin to 180 mg KOH/g resin in even still another embodiment. The acid value of the compatibilizer can be measured by any conventional titration method.

The melting point of the compatibilizer compound includes, for example, a melting point of above 40° C. in one embodiment, from 50° C. to 200° C. in another embodiment, from 100° C. to 200° C. in still another embodiment, and from 120° C. to 180° C. in yet another embodiment. The melting point of the compatibilizer can be measured by any well-known means. For example, the melting point of the compatibilizer of the present invention is measured by a conventional differential scanning calorimetry (DSC) method.

The amount of compatibilizer compound that is used to prepare the dispersion composition of the present invention includes, for example, from 5 wt % to 30 wt % in one embodiment, from 9 wt % to 20 wt % in another embodiment, from 9 wt % to 15 wt % in still another embodiment, and from 9 wt % to 12 wt % in yet another embodiment of total solid content.

Some of the benefits of using the compatibilizer compound include, for example, the compatibilizer provides an easy interaction of EVA polymers with a dispersion agent, and the compatibilizer provides an easy interaction of EVA polymers with a substrate such that an enhanced bonding performance can occurs.

The dispersing agent or dispersant compound that is used to prepare the dispersion composition of the present invention includes, for example, one or more dispersing agents known in the art. For example, in one embodiment the dispersing agent includes alkyl carboxylic acid; oleic acid (a fatty acid, in situ generated soap); dimer acids; other alkyl carboxylic acids with carbon atoms per each acid of from >12 to <20; and mixtures thereof.

The concentration of dispersing agent that is used to prepare the dispersion composition of the present invention includes, for example, <2 wt % solids of the formulation in one embodiment, <1.5 wt % in another embodiment, <1 wt % in still another embodiment, from 0.66 wt % to 1 wt % in yet another embodiment, and from 0.66 wt % to 0.75 wt % in even still another embodiment.

Exemplary of some of the advantageous properties exhibited by the dispersing agent when the dispersing agent is properly selected and in the proper amount include (1) providing stability to the polymer particles in the dispersion, and (2) providing a balance of the surface tension and wetting ability of the dispersion to substrates.

The process to make the dispersion composition of the present invention can include one or more additions of water to the composition. In one preferred embodiment for example, a first water addition is added to the composition in a sufficient amount to form a polymer continuous dispersion.

For example, the amount of the first water addition is from 3.5 wt % to 6 wt % based on total solids and water in one embodiment, from 3.5 wt % to 5 wt % in another embodiment and from 3.5 wt % to 4.5 wt % in still another embodiment.

The dispersion composition of the present invention includes a base to neutralize the available acid in the composition; and to separate the water addition that continues to result in a polymer continuous system. The base compound that is used to prepare the dispersion composition of the present invention includes, for example, one or more bases known in the art. For example, the neutralizing agent or base compound includes, aqueous potassium hydroxide (KOH), sodium hydroxide (NaOH), ammonia, and mixtures thereof. In one preferred embodiment, the base compound is, for example, KOH with a concentration of from 10 wt % to 90 wt %, from 20 wt % to 90 wt % in another embodiment, and from 40 wt % to 50 wt % in still another embodiment.

The amount of base that is used to prepare the dispersion composition of the present invention is, for example, from 70 percent (%) to 130% neutralization of the theoretical acid value of the components in one embodiment, from 80% to 120% in another embodiment, from 90% to 110% in still another embodiment, and from 90% to 100% in yet another embodiment.

Exemplary of some of the advantageous properties exhibited by the base can include neutralization to stabilize the polymer particles.

As aforementioned, the process to make the dispersion composition of the present invention includes one or more additions of water to the composition. In a preferred embodiment, a second water addition is added to the composition, for example, in an amount sufficient to phase invert to a water continuous dispersion.

For example, the amount of the second water addition is >3.5 wt %, based on the (1) total solids, (2) first water addition, and (3) second water addition, in one embodiment, from 20 wt % to 90 wt % in another embodiment, from 30 wt % to 70 wt % in still another embodiment, and from 40 wt % to 60 wt % in yet another embodiment.

The dispersion composition of the present invention may also include other additional optional compounds or additives; and such optional compounds may be added to the composition in combination with one or more of the components (a)-(f). The optional additives or agents that can be used to prepare the dispersion composition of the present invention includes, for example, one or more optional compounds known in the art for their use or function. For example, the optional additive includes, but is not limited to, defoamers, rheology modifiers, wetting agents, and mixtures thereof.

The amount of optional compound, when used to prepare the dispersion composition of the present invention, includes, for example, from 0 wt % to 5 wt % in one embodiment, from 0.001 wt % to 3 wt % in another embodiment, from 0.01 wt % to 2 wt % in still another embodiment, and from 0.1 wt % to 1 wt % in yet another embodiment.

In a general embodiment, the process for making the dispersion composition of the present invention includes the steps of admixing, for example, melt blending: (a) at least one vinyl acetate copolymer such as EVA; (b) at least one compatibilizer; (c) at least one dispersing agent; (d) a first water addition to provide a polymer continuous dispersion; (e) at least one base added to neutralize the available acid, separate from the water addition that continues to result in a polymer continuous system; and (f) a second water addition to provide a phase inversion to a water continuous dispersion.

Generally, the process apparatus and ancillary equipment useful in the present invention for forming a homogeneous melt blend can include any means and under any conditions which are typically used for melt-blending thermoplastic resins; and which are known to those familiar with an extruder-based process. For example, the apparatuses that can be used in the present invention includes heat exchangers, back pressure regulators, melt pumps, gear pumps; kneaders, BANBURY® mixers, rotor stator mixers, single-screw extruders, twin-screw extruders, multi-screw extruders; and the like.

In addition, various schemes for setting up the process equipment can be used. For example, in one embodiment, a first mixing apparatus is used in combination with a second mixing apparatus. For instance, in some embodiments, the first mixing apparatus is, for example, a kneader, a BANBURY® mixer, a single-screw extruder, or a multi-screw extruder; and the second mixing apparatus is, for example, an extruder such a twin-screw extruder having multiple heating zones. For instance, in other embodiments, the first mixing apparatus is, for example, an extruder such as a twin-screw extruder; and the second mixing apparatus is a rotor stator mixer.

In another embodiment, a single extruder, for example, a twin-screw extruder having multiple heating zones with ancillary equipment such as a back-pressure regulator, a melt pump, or a gear pump, is used to produce a waterborne dispersion composition of the present invention. For instance, in various embodiments, the extruder can have various zones including, for example, (1) a conveying, melting, and mixing zone, (2) an emulsification zone, and (3) a dilution zone; and the different zones can be operated at predetermined temperatures. In some embodiments, the conveying, melting, and mixing zone portion of the extruder can have a barrel of Length "L" and a diameter of Diameter "D", and the length-to-diameter ratio (L/D) used is, for example, not less than 12 to 1, such as from 12 to 1 to 60 to 1 in one preferred embodiment. In some preferred embodiments, the above-described extruder-based processes that are used in the present invention are described in more detail, for example, in U.S. Provisional Patent Application No. 62/579,354, filed Oct. 31, 2017 by Escobar Marin et al.

In another embodiment, the waterborne dispersion composition is prepared, for example, using an extruder-based continuous process in accordance with the following general process: the above components (a)-(f) of the composition of the present invention are fed into an extruder using, for example, a controlled rate feeder. As described above, any conventional extruder can be used in the present invention. In one embodiment, the extruder includes, for example, a 25-millimeter (mm) diameter twin screw extruder having an L/D ratio as described above. The feed rate in grams/minute (g/min) for the components (a)-(f) is, for example, from 60 g/min to 150 g/min in one embodiment. The components of the present invention are forwarded through the extruder and melted to form a liquid melt material.

The extruder temperature profile can be ramped up to a predetermined temperature. For example, in one embodiment the ramp up temperature is from 70° C. to 240° C., and 120° C. to 150° C. in another embodiment. Water is then fed to the extruder, at a predetermined rate, for example, at a rate of from 1.0 g/min to 2.0 g/min in one embodiment. Following the water feed, a neutralizing agent is fed to the extruder using a second introduction site in the extruder, at a predetermined rate, for example, at a rate of from 1.4 g/min to 2.4 g/min in one embodiment. A phase inversion water is fed into the extruder through an entry location of the extruder after the neutralizing agent; and the water is fed to the extruder at a predetermined rate, for example, at a rate of from 1.0 g/min to 8.0 g/min in one embodiment. Dilution water is also fed into the extruder in one or two entry locations (1st and $2^{nd}$ entry locations) of the extruder using two separate pumps at predetermined rates, for example, at a rate of from 20 g/min to 90 g/min in one embodiment. The extruder temperature profile is cooled back down to a temperature, for example, below 100° C. near the end of the extruder. At the extruder outlet, a backpressure regulator is used to adjust the pressure inside the extruder barrel to a pressure adapted to reduce steam formation. Generally, the pressure inside the extruder barrel is, for example, from 2 megapascals [MPa] to 4 MPa in one embodiment.

After the above process steps, a resultant aqueous dispersion product exits from the extruder. In one preferred embodiment, the aqueous dispersion is then filtered through a 200 microns (µm) filter. The resultant filtered aqueous dispersion has a solids content, measured in weight percent (wt %); and the solids particles of the dispersion has a volume mean particle size measured in microns. For example, the solids content of the dispersion is from 30 wt % to 50 wt % in one embodiment; and the particle size of the particles in the dispersion is from 0.9 µm to 2.0 µm in one embodiment. In some embodiments, the particle size mode may also be recorded. The solids content of the aqueous dispersion is measured using conventional instrumentation, for example, an Ohaus® MB45 infrared solids analyzer (available from Ohaus Corporation); and the particle size of the solids particles of the aqueous dispersion is measured also using conventional instrumentation, for example, a Coulter® LS-230 particle size analyzer (available from Beckman Coulter Corporation). In one preferred embodiment, the solids content and the mean particle size (PS) of the solids particles of the dispersion is as described in Table IV of the Examples.

In one embodiment, the waterborne dispersion composition is, for example, a wax-free waterborne dispersion composition. In a preferred embodiment, the wax-free waterborne dispersion composition is made, for example, using an extruder-based continuous process. The process steps include, for example, the process steps of:

(A) providing an extruder;
(B) feeding a mixture of: (i) at least one vinyl acetate copolymer; (ii) at least one compatibilizer; and a dispersing agent into the extruder;
(C) feeding a first water addition to the mixture of step (B) in the extruder to provide a polymer continuous dispersion;
(D) feeding at least one base to the mixture of step (C) in the extruder to neutralize any available acid present in the mixture of step (C); and
(E) feeding a second water addition to the mixture of step (D) in the extruder to provide a phase inversion forming a water continuous dispersion.

In another embodiment, step (B) of the above process can be separated into two steps. For example, (i) at least one vinyl acetate copolymer and (ii) at least one compatibilizer is first mixed together to form a mixture and the mixture is then fed, as a stream into the extruder; and the at least one dispersing agent is fed, as a separate stream, into the extruder.

The dispersion composition of the present invention, prepared in accordance with the process described above, has several beneficial properties including, for example, a small particle size and a narrow particle distribution and such properties advantageously results, for example, in a good coating appearance; a good coating uniformity; better shelf stability, and a preferred solid content.

For example, the solids content of the dispersion of the present invention is from 20% solids to 80% solids in one embodiment; from 30% solids to 70% solids in another embodiment, and from 35% solids to 55% solids in still another embodiment. The solids content of the dispersion can be measured, for example, by an Ohaus MB45 infrared moisture analyzer (available from Ohaus Corporation) or by a thermal oven. In a preferred embodiment, the solids content of the dispersion is measured by the above moisture analyzer.

For example, the viscosity property of the dispersion of the present invention is from 10 millipascals-seconds (mPa·s) to 100 mPa·s in one embodiment; from 20 mPa·s to 60 mPa·s in another embodiment, and from 30 mPa·s to 50 mPa·s in still another embodiment. The viscosity property of the dispersion is measured, for example, using a Brookfield DV-II+ (available from Brookfield).

For example, the particle size of the particles in the dispersion of the present invention is from 0.2 microns (µm) to 6 µm in one embodiment; from 0.3 µm to 4 µm in another embodiment, and from 0.4 µm to 2 µm in still another embodiment. The particle size of the dispersion can be measured by any well-known particle size measuring instruments. In one embodiment, the particle size of the dispersion is measured, for example, using a Beckman Coulter LS 13 320 instrument.

In addition to the above properties, the performance of the dispersion composition is evaluated in terms of, for example, shelf stability, and tested by accelerated temperature aging at 45° C. and at refrigerated conditions. For example, the shelf stability of the dispersions of the present invention is evaluated by aging in: (1) a refrigerated (4° C.) environment and (2) a heated (45° C.) oven, by tracking the phase separation and viscosity weekly of the dispersion. If the dispersions settle down and separates into two layers; significantly changes in viscosity above 100%; or becomes gelatinous (i.e., gelation occurs), the dispersion is shelf instable.

Then the overall stability of the dispersion can be compared to a commercial product produced using a batch process. In one embodiment, the dispersion is rated, for example, as having a "good" shelf stability or a "worse' shelf stability as compared to the batch process product. For example, a "good" shelf stability means that the dispersion performed the same as, or better than, the batch process commercial product; and a "worse" shelf stability means that the dispersion performed worse than the batch process commercial product.

As aforementioned, once the dispersion composition of the present invention is made, the dispersion composition can be used as a HSC for various applications. For example, in one embodiment, the HSC dispersion composition can be used to produce a HSC on a substrate such as a film for food packaging and then the film substrate can be heat sealed.

The HSC dispersion composition can be applied to a substrate using various conventional coating methods such as gravure coating, Meyer rod coating, curtain coating, an air-knife coating process, a flexographic process, and an offset printing process.

The dispersion composition of the present invention provides a HSC that can advantageously be used for various applications such as for heat sealing food and industrial packages. The HSC of the present invention also exhibits several beneficial properties, including, for example: a good coating appearance, a high bond strength, and a high hot tack, and no yellowing.

For example, in one embodiment the appearance of the coating formed from the HSC dispersion of the present invention is evaluated by visually observing the coating of the present invention and comparing the present invention HSC to a batch process HSC coated on PET films. The HSC appearance can be reported, for example, according to the following rating system: a HSC having a "good" coating appearance as determined by visual observation versus a HSC having an "oily" coating appearance as determined by visual observation. A HSC with a "good" coating appearance is a coating observed to have an acceptable glossy and good smooth coating; and an "oily" coating appearance is a HSC observed to have an ugly oily appearance and is unacceptable. In addition, HSCs made using a conventional batch process can also appear to be an undesirable "yellow" color or unclear, by visual observation compared to HSCs made in accordance with the present invention which has no "yellowing" appearance, but instead can be observed to have a clear coating.

For example, in one embodiment the sealing performance of the HSC of the present invention, in terms of bond strength, is better than a batch process. For example, the bond strength of the HSC of the present invention is: from 20% to 300% better than a batch process in one embodiment, from 50% to 200% better than a batch process in another embodiment, from 60% to 150% better than a batch process in still another embodiment; and from 70% to 100% better than a batch process in yet another embodiment. The sealing property of the HSC is measured, for example, by a bond test as described herein below in the Examples.

For example, in one embodiment the hot tack property of the HSC of the present invention is better than a batch process. For example, the hot tack property of the HSC of the present invention is: from 10% to 200% better than a batch process in one embodiment; from 20% to 150% better than a batch process in another embodiment, from 25% to 100% better than a batch process in still another embodiment; and from 30% to 80% better than a batch process in yet another embodiment. The hot tack property of the HSC is measured, for example, using a temperature controlled Instron testing instrument operated at 200 millimeters per second (mm/s) speed according to ASTM F1921, test method B.

As aforementioned, the dispersion composition can be used to manufacture a HSC for food packaging articles. Other applications wherein the dispersion composition can be used include, for example, industrial skin packaging, and medical packaging applications; and the like.

EXAMPLES

The following examples are presented to further illustrate the present invention in detail but are not to be construed as limiting the scope of the claims. Unless otherwise indicated, all parts and percentages are by weight.

Various terms and designations; and raw materials or ingredients used in the Inventive Examples (Inv. Ex.) and the Comparative Examples (Comp. Ex.) which follow are described in Table I.

TABLE I

List of Compounds

| Compound | Brief Description | Supplier |
|---|---|---|
| Elvax ® 410 | ethylene-vinyl acetate copolymer resin, 18 wt % vinyl acetate comonomer. | DuPont |
| Elvax 265 | ethylene-vinyl acetate copolymer resin, 28 wt % vinyl acetate comonomer. | DuPont |
| Elvax 150W | ethylene-vinyl acetate copolymer resin, 32 wt % vinyl acetate comonomer. | DuPont |
| Dymerex Polymerized Rosin | highly dimerized rosin acids | Eastman Chemical Company |
| oleic acid | 90% technical grade, vegetable based | Alfa Aesar |
| KOH | potassium hydroxide | |
| Engage ™ 8137 | ethylene-octene copolymer with low density and a high melt index | The Dow Chemical Company |
| Retain ™ 3000 | functional polymer | The Dow Chemical Company |
| Licocene ® 4351 | functionalized metallocene polyethylene | Clariant Plastics & Coatings Ltd. |
| Adcote ™ 37JD1198 | wax heat seal coating material | The Dow Chemical Company |

TABLE II

Component Properties

| Material | Function | Vinyl Acetate (wt %) | Acid Number (mg KOH/g) | Density (g/cm³) | Melt Index (g/10 min at 190° C., 2.16 kg) | Melting Point (° C.) |
|---|---|---|---|---|---|---|
| Elvax 410 | base polymer | 18 | | 0.934 | 500 | 73 |
| Elvax 265 | base polymer | 28 | | 0.951 | 3 | 73 |
| Elvax 150W | base polymer | 32 | | 0.957 | 43 | 63 |
| Dymerex | compatibilizer | | 145 | 1.069 | | |
| oleic acid | dispersant | | 200 | 0.895 | | |
| Potassium hydroxide (KOH) | | | | | | |

TABLE III

Dispersion Formulations

| Example No. | Dispersion Composition (Weight Ratio) |
|---|---|
| Comp. Ex. A | 45/45/10; Elvax 410/Elvax 265/Dymerex with 5% oleic acid |
| Comp. Ex. B | 45/45/10; Elvax 410/Elvax 265/Dymerex with 3.8% oleic acid |
| Comp. Ex. C | 45/45/10; Elvax 410/Elvax 265/Dymerex with 2.2% oleic acid |
| Comp. Ex. D | 45/45/10; Elvax 410/Elvax 265/Dymerex with 1.5% oleic acid |
| Inv. Ex. 1 | 45/45/10; Elvax 410/Elvax 265/Dymerex with 0.33% oleic acid |
| Comp. Ex. E | Elvax 150W with 0.75% oleic acid |
| Inv. Ex. 2 | 90/10; Elvax 150W/Dymerex with 0.75% oleic acid |

TABLE III-continued

Dispersion Formulations

| Example No. | Dispersion Composition (Weight Ratio) |
|---|---|
| Comp. Ex. F | 80/10/10; Engage 8137/Retain 3000/Licocene 4351 with 3.84% oleic acid |
| Comp. Ex. G | Adcote 37JD1198 prepared by batch process commercially |
| Comp. Ex. H | 45/45/10; Elvax 410/Elvax 265/Dymerex with 1.0% oleic acid |
| Comp. Ex. I | 45/45/10; Elvax 410/Elvax 265/Dymerex with 3.8% oleic acid |

TABLE IV

| | | | | Dispersion Conditions | | |
|---|---|---|---|---|---|---|
| Example No. | Component 1 (feed rate, g/min) | Component 2 (feed rate, g/min) | Component 3 (feed rate, g/min) | Initial Water (feed rate, g/min) | Base/ Surfactant (feed rate, g/min) | Phase Inversion Water (feed rate, g/min) |
| Comp. Ex. A | Elvax 410:Elvax 265; 1:1; (64.8) | Dymerex (7.2) | oleic acid (3.401) | 2.5 | 30% KOH (4.46) | NA[2] |
| Comp. Ex. B | Elvax 410:Elvax 265; 1:1; (65.8) | Dymerex (7.2) | oleic acid (2.596) | 2.0 | 30% KOH (4.05) | NA |
| Comp. Ex. C | Elvax 410:Elvax 265; 1:1; (64.8) | Dymerex (7.2) | oleic acid (1.489) | 1.0 | 30% KOH (3.48) | NA |
| Comp. Ex. D | Elvax 410:Elvax 265; 1:1; (68.14) | Dymerex (7.56) | oleic acid (1.030) | 1.8 | 30% KOH (3.12) | NA |
| Inv. Ex. 1 | Elvax 410:Elvax 265:Dymerex; 45:45:10; (75.70) | | oleic acid (0.223) | 2.00 | 30% KOH (3.05) | 3.00 |
| Comp. Ex. E | Elvax 150W; (75.67) | | oleic acid (0.510) | 2.00 | 30% KOH (0.31) | 6.00 |
| Inv. Ex. 2 | Elvax 150W; (68.10) | Dymerex (7.57) | oleic acid (0.510) | 1.00 | 30% KOH (3.1) | 6.00 |
| Comp. Ex. F | Engage 8137; (60.53) | Licocene 4351:Retain 3000 (7.56:7.56) | oleic acid (3.01) | 3.00 | 30% KOH (2.28) | 3.00 |
| Comp. Ex. H | Elvax 410:Elvax 265:Dymerex; 45:45:10; (75.70) | | oleic acid (0.67) | 2.0 | 30% KOH (3.28) | 1.0 |
| Comp. Ex. I | Elvax 410:Elvax 265:Dymerex; 45:45:10; (75.70) | | oleic acid (2.661) | 2.0 | 30% KOH (4.35) | 3.0 |

| | | | Dispersion Conditions | | | | |
|---|---|---|---|---|---|---|---|
| Example No. | Dilution Water $1^{st}/2^{nd}$ (feed rate, g/min) | Extruder Temp. in Polymer Melt Zone (°C.) | Extruder Speed (RPM) | % Solids | $V_{mean}$ PS[1] (microns) | Dispersion mode | Viscosity (Brookfield, mPa·s) |
| Comp. Ex. A | 10/60 | 120 | 450 | 49.96 | 0.973 | 1.204 | 49.8 |
| Comp. Ex. B | 10/60 | 120 | 450 | 50.84 | 1.346 | 1.592 | 49.0 |
| Comp. Ex. C | 10/60 | 120 | 450 | 47.08 | 1.249 | 1.204 | 41.2 |
| Comp. Ex. D | 10/60 | 120 | 450 | NA | 4.0 | 4.0 | NM[4] |
| Inv. Ex. 1 | 27.50/60.00 | 120 | 800 | 45.14 | 1.224 | 1.321 | 36.6 |
| Comp. Ex. E | 0/130 | 150 | 800 | NA | ND[3] | NA | NA |
| Inv. Ex. 2 | 0/80 | 150 | 800 | NA | 0.665 | 0.627 | NM |
| Comp. Ex. F | 30/0 | 140 | 450 | NA | ND | NA | NA |
| Comp. Ex. H | 27.5/60 | 120 | 450 | 45.74 | 2.031 | 2.107 | 21.0 |
| Comp. Ex. I | 87.5/0 | 120 | 800 | 44.26 | 2.042 | 2.313 | 25.0 |

Notes for Table IV:
[1]"$V_{mean}$ PS" stands for "volume mean particle size".
[2]"NA" stands for "not applicable".
[3]"ND" stands for "no dispersion".
[4]"NM" stands for "not measured".

Comparative Examples A-D

General Procedure for Preparing Dispersions

In Comp. Ex. A-D, aqueous dispersions were prepared using the following general procedure:

The Components 1-3 described in Table IV were fed into a 25 mm diameter twin screw extruder using a controlled rate feeder; and using a feed rate in g/min as described in Table IV. The Components 1-3 were forwarded through the extruder and melted to form a liquid melt material.

The extruder temperature profile was ramped up to the temperature described in the "Polymer Melt Zone" column of Table IV. Water and neutralizing agent were mixed together and fed to the extruder, at a feed rate described in Table IV, for neutralization at an initial water introduction site. Then dilution water was fed into the extruder in one entry location or in two separate entry locations (1st and 2nd entry locations) using two separate pumps at the feed rates described in Table IV. The extruder temperature profile was cooled back down to a temperature below 100° C. near the end of the extruder. At the extruder outlet, a backpressure regulator was used to adjust the pressure inside the extruder barrel to a pressure adapted to reduce steam formation.

An aqueous dispersion product exited from the extruder. The aqueous dispersion was filtered through a 200 μm filter. The resultant filtered aqueous dispersion had a solids content measured in weight percent (wt %); and the solids particles of the dispersion had a volume mean particle size ($V_{mean}$ PS) measured in microns and recorded in Table IV. In some cases, the particle size mode was also recorded. The solids content of the aqueous dispersion was measured using an infrared solids analyzer; and the particle size of the solids particles of the aqueous dispersion was measured using a Coulter LS-230 particle size analyzer (available from Beckman Coulter Corporation). The solids content and the mean particle size (PS) of the solids particles of the dispersion are described in Table IV.

Examples 1 and 2 and Comparative Examples E-I

In Inv. Ex. 1 and 2 and Comp. Ex. E-I, aqueous dispersions were prepared using the General Procedure for Preparing Dispersions described in Comp. Ex. A-D above except that after the extruder temperature profile was ramped up to the temperature described in the "Polymer Melt Zone" column of Table IV, water and neutralizing agent were fed to the extruder separately. Water was fed to the extruder, at a rate described in Table IV, followed by neutralizing agent, at a rate described in Table IV, in a second introduction site. The phase inversion water was fed into the extruder in an entry location of the extruder after the neutralizing agent.

Property Measurements
Solids Content Measurements

The solids content of the dispersions was measured by an Ohaus MB45 infrared moisture analyzer. The analyzer was set to 150° C. with measurement completion set to <1 milligram (mg) loss in 90 seconds(s).

Viscosity Measurements

The viscosity of the dispersions was tested by a Brookfield DV-II+. The measurements were done at 20 revolutions per minute (RPM) and 25° C., using RV spindles.

Particle Size Measurements

Particle size measurement of the dispersions was performed with a Beckman Coulter LS 13 320 instrument. The instrument was fitted with a Universal Liquid Module, containing DI water, and the data was analyzed using an optical model with a fluid refractive index of 1.332 and a sample refractive index of 1.5 real and 0 imaginary.

Performance Evaluation Tests

The performance of all of the dispersion compositions were evaluated by comparing the performance of the dispersions to the performance of a commercial product made by a batch process. The "batch process commercial product" is available from The Dow Chemical Company as Adcote 37JD1198.

The dispersion samples were coated onto a substrate by hand using a Meyer rod drawdown bar and a drawdown method; and the dry coating weight was adjusted to about 5.5-6.0 g/m². After drawdown, the wet coating was dried at 90° C. in an oven for about 2 minutes (min).

Shelf Stability

Shelf stability of the dispersions was evaluated at: (1) a refrigerated (4° C.) environment and (2) a heated (45° C.) oven aging, by tracking the phase separation and viscosity weekly. The overall stability of each of the dispersions was compared to the batch process commercial product; and the results were reported according to the following rating system: A dispersion with a "good" shelf stability meant that the dispersion performed the same as the batch process commercial product; and a "worse' shelf stability meant that the dispersion performed worse than batch process commercial product.

Coating Appearance

The appearance of a HSC formed from the dispersions on PET films was visually observed and compared to Adcote 37JD1198. Coating appearance was reported according to the following rating system: A HSC with a "good" coating appearance was observed to have an acceptable glossy and good smooth coating; and an "oily" coating appearance was observed to have an ugly oily appearance and was not acceptable.

Heat Sealed Substrates

Heat sealed substrates were prepared by heat sealing a primer substrate to a second substrate using the following method:

The primer substrate comprised a commercially available 92 g PET, pre-laminated PET-aluminum foil side.

The second substrate comprised a commercially available 92 g PET, polyvinylchloride (PVC) sheet 4 mils, polyethylene terephthalate glycol (PETG) sheet 4 mils, low density polyethylene (LDPE) sheet 4 mils, aluminum (Al) foil.

A dispersion composition of the present invention was coated onto the surface of the primer substrate using a hand drawdown procedure. The primer substrate, coated with the wet dispersion composition, was then contacted with the second substrate. The wet coated primer substrate and second substrate was dried in a 90° C. oven for about 2 min. The dried target coating weight was adjusted to 5.5 g/m² to 6.0 g/m².

Bond Test of the Heat Sealed Substrates

A bond test of the heat-sealed substrates was conducted under the following conditions: at a pressure of 2.76 bar, at a time of 1.0 s, and at two different temperatures (93.33° C. and 121.11° C.).

The bond test was conducted using a 25.4×25.4 mm² sealed area strip at 254 mm/min speed. Three strips were tested for each sample and an average value reported.

Hot Tack of the Heat Sealed Substrates

The hot tack measurement of the heat-sealed substrates was conducted using a temperature controlled Instron® testing instrument (available from Instron) at a speed of 200 mm/s according to the method described in ASTM F1921, test method B.

Shelf-Life Stability

For evaluating shelf life stability, samples were kept at 4° C. (in a refrigerator) and samples were kept at 45° C. (in an oven) for various periods of time. The shelf life stability of the samples was tested by visual observation and the results of the test are summarized in Table V.

TABLE V

Shelf Stability of Dispersions

| Property | Comp. Ex. A | Comp. Ex. B | Comp. Ex. C | Comp. Ex. G (Batch process) | Inv. Ex 1 |
|---|---|---|---|---|---|
| Aging at 4° C. (refrigerated) | good | good | good | good | good |
| Aging at 45° C. | worse | worse | worse | good | good |

The shelf life stability in terms of viscosity of the dispersions, after keeping samples at 4° C. (in a refrigerator) and keeping samples at 45° C. (in an oven) for various periods of time, is summarized in Table VI.

TABLE VI

Shelf Stability of Dispersions - Viscosity

| Aging Time (weeks) | Inv. EX. 1 (aged at 45° C.) (mPa · s) | Comp. Ex. G (batch process, aged at 45° C.) (mPa · s) | Inv. EX. 1 (aged at 4° C.) (mPa · s) | Comp. Ex. G (batch process, aged at 4° C.) (mPa · s) |
|---|---|---|---|---|
| 0 | 184 | 584 | 184 | 584 |
| 1 | 206 | 566 | 183 | 575 |
| 2 | 198 | 640 | 191 | 589 |
| 4 | 234 | 714 | 187 | 582 |

The samples of Comp. Ex. H and Comp. Ex. I generated a hazy oily coating appearance; and thus, no further bond strength testing was conducted on the samples of Comp. Ex. H and Comp. Ex. I.

TABLE VI

Bonding Strength of Coatings (90° Peel Test Results—Coated PET Sealed to Different Substrates

| Substrate/Seal Temperature (° C.) | Comp. Ex. A (g/25 mm) | Comp. Ex. B (g/25 mm) | Comp. Ex. C (g/25 mm) | Comp. Ex. G (Batch process,) (g/25 mm) | Inv. Ex. 1 (g/25 mm) |
|---|---|---|---|---|---|
| Coating appearance on PET | oily | oily | hazy, low gloss | good | good |
| PETG/93.33 | 23 | 5.5 | 4.3 | 30 | 1 |
| PETG/121.11 | 28 | 27 | 7 | 96 | 115 |
| PVC/93.33 | 87 | 105 | 29 | 137 | 210 |
| PVC/121.11 | 60 | 79 | 302 | 359 | 646 |
| LDPE/93.33 | 76 | 63 | 123 | 164 | 212 |
| LDPE/121.11 | 53 | 51 | 348 | 835 | 660 |
| Al Foil/93.33 | 26 | 20 | 14 | 33 | 35 |
| AL Foil/121.11 | 52 | 35 | 26 | 158 | 230 |
| PET/93.33 | 38 | 32 | 18 | 82 | 140 |
| PET/121.11 | 40 | 29 | 17 | 147 | 271 |
| Coat to coat/93.33 | 90 | 111 | 232 | 121 | 135 |
| Coat to coat/121.11 | 106 | 33 | 255 | 666 | 786 |

TABLE VII

Bonding Strength of Coatings (90° Peel Test Results—Coated Tyvek, Sealed to Different Substrates

| Substrate/Seal Temperature (° C.) | Comp. Ex. A (g/25 mm) | Comp. Ex. B (g/25 mm) | Comp. Ex. C (g/25 mm) | Comp. Ex. G (Batch process,) (g/25 mm) | Inv. Ex. 1 (g/25 mm) |
|---|---|---|---|---|---|
| PETG/93.33 | 94 | 40 | 59 | 128 | 138 |
| PETG/121.11 | 24 | 25 | 47 | 243 | 351 |
| PVC/93.33 | 416 | 307 | 149 | 299 | 234 |
| PVC/121.11 | 486 | 559 | 636 | 498 | 575 |
| LDPE/93.33 | 152 | 228 | 149 | 81 | 170 |
| LDPE/121.11 | 510 | 476 | 588 | 599 | 465 |
| Al Foil/93.33 | 215 | 67 | 24 | 89 | 100 |
| AL Foil/121.11 | 68 | 82 | 173 | 283 | 455 |
| PET/93.33 | 117 | 26 | 15 | 89 | 134 |
| PET/121.11 | 17 | 12 | 109 | 474 | 395 |
| Coat to coat/93.33 | 117 | 26 | 15 | 549 | 497 |
| Coat to coat/121.11 | 651 | 705 | 850 | 783 | 628 |

TABLE VIII

Bonding Strength of Coatings (90° Peel Test Results)

| Temperature (° C.) | Comp. Ex. G (N/25 mm$^2$) | Inv Ex. 1 (N/25 mm$^2$) |
|---|---|---|
| 50 |  | 0.26 |
| 60 | 0.81 | 1.9 |
| 70 | 2.52 | 4.06 |
| 80 | 2 | 2.81 |
| 90 | 1.57 | 1.79 |
| 100 | 0.94 | 1.33 |
| 110 | 0.89 | 1.03 |
| 120 | 0.61 | 0.96 |
| 130 |  | 1.1 |

What is claimed is:

1. A process for making a waterborne dispersion composition made using an extruder-based continuous process comprising the steps of:
   (A) providing an extruder;
   (B) feeding a mixture of:
      (i) at least one vinyl acetate copolymer;
      (ii) at least one compatibilizer selected from the group consisting of rosin acid, rosin ester, phenolic resin, and combinations thereof; and
      (iii) a dispersing agent that is an alkyl carboxylic acid into the extruder;
   (C) feeding a first water addition to the mixture of step (B) in the extruder to provide a polymer continuous dispersion;
   (D) feeding at least one base to the mixture of step (C) in the extruder; and
   (E) feeding a second water addition to the mixture of step (D) in the extruder to form a water continuous dispersion that is wax-free and comprises
      (i) from 80 wt % to 90 wt % vinyl acetate copolymer, and
      (ii) less than 1.5 wt % dispersing agent, based on the solids weight percent of the water continuous dispersion.

2. The process of claim 1, wherein each of the components: (i) at least one vinyl acetate copolymer; (ii) at least one compatibilizer; and (iii) at least one dispersing agent are fed into the extruder separately.

3. The process of claim 1, wherein the components: (i) at least one vinyl acetate copolymer; (ii) at least one compatibilizer; and (iii) at least one dispersing agent are fed into the extruder together.

4. The process of claim 1, wherein the extruder has a first feeding zone near the front end of the extruder, a second feeding zone near the middle of the extruder, and a third feeding zone near the back end of the extruder.

5. The process of claim 4, wherein the temperature of the first feeding zone is from 90° C. to 150° C.

6. The process of claim 5, wherein the temperature of the second feeding zone is from 90° C. to 150° C.

7. The process of claim 6, wherein the temperature of the third feeding zone is from 80° C. to 150° C.

8. The process of claim 1, wherein the dispersion produced by the process has a shelf stability of greater than 1 year at room temperature and has a particle size of less than 2 microns.

9. The process of claim 1, wherein the at least one vinyl acetate copolymer is an ethylene vinyl acetate copolymer and fed into the extruder at a concentration of from 80 weight percent to 90 weight percent of total solids.

10. The process of claim 1, wherein the at least one compatibilizer is a highly dimerized rosin acid and is fed into the extruder at a concentration of from 5 weight percent to 30 weight percent of total solids.

11. The process of claim 1, wherein the at least one dispersing agent is oleic acid and is fed into the extruder at a concentration from 0.1 weight percent to 5 weight percent of total solids.

12. The process of claim 1, wherein the amount of water fed into the extruder to the first water addition is from 3.5 weight percent to 6 weight percent of the total solids and first water addition.

13. The process of claim 1, wherein the at least one base is potassium hydroxide and is fed into the extruder at a concentration of from 80 percent to 120 percent neutralization of the theoretical acid value of the components.

14. The process of claim 1, wherein the amount of water fed into the extruder in the second water addition is greater than or equal to 3.5 weight percent of the total solids, first and second water additions.

15. A heat seal coating for food packaging or for industrial packaging comprising the dispersion composition made by the process of claim 1.

16. The process of claim 1, wherein the water continuous dispersion comprises from 0.66 wt % to 0.75 wt % of the dispersing agent.

17. The process of claim 16 comprising (D) feeding the at least one base separately from the (C) feeding the first water addition.

18. The process of claim 17 comprising (E) feeding the second water addition separately from the (D) feeding the at least one base.

19. The process of claim 18 wherein step (D) occurs after step (C) and step (E) occurs after step (D).

* * * * *